(12) United States Patent
Choi (10) Patent No.: US 10,784,838 B2
(45) Date of Patent: Sep. 22, 2020

(54) AIR-GAP TYPE FILM BULK ACOUSTIC RESONATOR AND METHOD OF MANUFACTURING THE SAME

(71) Applicant: WISOL CO., LTD., Gyeonggi-do (KR)

(72) Inventor: Hoan Jun Choi, Gyeonggi-do (KR)

(73) Assignee: WISOL CO., LTD., Gyeonggi-Do (KR)

( * ) Notice: Subject to any disclaimer, the term of this patent is extended or adjusted under 35 U.S.C. 154(b) by 152 days.

(21) Appl. No.: 15/970,064

(22) Filed: May 3, 2018

(65) Prior Publication Data
US 2019/0097603 A1    Mar. 28, 2019

(30) Foreign Application Priority Data

Sep. 25, 2017   (KR) .......................... 10-2017-0123341

(51) Int. Cl.
*H03H 9/17*   (2006.01)
*H03H 3/02*   (2006.01)

(52) U.S. Cl.
CPC .............. *H03H 9/173* (2013.01); *H03H 3/02* (2013.01); *H03H 2003/021* (2013.01)

(58) Field of Classification Search
CPC .... H03H 9/173; H03H 3/02; H03H 2003/021; H03H 2003/023

USPC ......................................... 333/133, 187, 188
See application file for complete search history.

(56) References Cited

U.S. PATENT DOCUMENTS

| 7,479,685 B2* | 1/2009 | Fazzio | H03H 3/02 257/245 |
| 9,608,592 B2* | 3/2017 | Bi | H03H 9/173 |
| 2010/0033063 A1* | 2/2010 | Nishihara | H03H 9/02118 310/365 |
| 2017/0170807 A1* | 6/2017 | Yokoyama | H03H 9/171 |

* cited by examiner

*Primary Examiner* — Robert J Pascal
*Assistant Examiner* — Jorge L Salazar, Jr.
(74) *Attorney, Agent, or Firm* — Harness, Dickey & Pierce, P.L.C.

(57) ABSTRACT

Disclosed is an air gap type film bulk acoustic resonator (FBAR). The air gap type FBAR includes a substrate which includes an air gap portion in a top surface thereof, a lower electrode formed on the substrate, a piezoelectric layer formed on the lower electrode, and an upper electrode formed on the piezoelectric layer. Here, the lower electrode includes a first lower electrode formed spaced apart from the air gap portion in the substrate and a second lower electrode formed on the substrate to be separated from the first lower electrode by being stacked to surround only a part of a top of the air gap portion in order to form a non-deposition area of the air gap portion.

6 Claims, 9 Drawing Sheets

AIR-GAP TYPE FILM BULK ACOUSTIC RESONATOR AND METHOD OF MANUFACTURING THE SAME

CROSS-REFERENCE TO RELATED APPLICATION

This application claims priority to and the benefit of Korean Patent Application No. 2017-0123341, filed on Sep. 25, 2017, the disclosure of which is incorporated herein by reference in its entirety.

FIELD

The present invention relates to a film bulk acoustic resonator (FBAR) available for a filter, a duplexer, and the like for communication in a radio frequency band, and more particularly, to an air gap type FBAR and a method of manufacturing the same.

BACKGROUND

A wireless mobile communication technology needs a variety of radio frequency (RF) components capable of efficiently transmitting information in a limited frequency band. Particularly, a filter among the RF components is one of key components used for the wireless communication technology and selects a signal necessary for a user or filters out a signal to be transmitted among countless sky radio waves to enable high-quality communication.

Currently, as RF filters most generally used for wireless communication, a dielectric filter and a surface acoustic wave (SAW) filter are present. Dielectric filters have advantages such as high dielectric permittivity, a low insertion loss, and stability at a high temperature, vibration resistance, and shock resistance. However, dielectric filters have limitations in miniaturization and monolithic microwave integrated circuit (MMIC) manufacturing, which are recent technology development trends. Also, SAW filters have a smaller size than that of dielectric filters, easily process signals, have a simple circuit, and are available for mass production through a semiconductor manufacturing process. Also, SAW filters have an advantage of sending and receiving high-quality information due to high side rejection in a passband in comparison to dielectric filters. However, since an SAW filter process includes a light exposure process using ultraviolet (UV) rays, there is a disadvantage in which a line width of an interdigital transducer (IDT) is limited to about 0.5 μm. Accordingly, it is impossible to cover a superhigh frequency band (of 5 GHz or higher) using an SAW filter, and basically, it is difficult to configure an MMIC structure and a single chip, which are formed on a semiconductor substrate.

To overcome the above limitations, a film bulk acoustic resonator (FBAR) filter capable of completely making a frequency control circuit an MMIC by being integrated with other active elements on an existing silicon (Si) or gallium arsenide (GaAs) substrate has been provided.

Since FBARs are thin film elements which feature a low cost, a small size, and a high quality factor, FBARs are available for a wireless communication device, a military radar, and the like in a variety of frequency bands (900 MHz to 10 GHz). Also, FBARs may be miniaturized to a size of a millionth of those of a dielectric filter and lumped constant circuit (LC) filters and may have very low an insertion loss than those of SAW filters. Accordingly, FBARs may be most adequate elements for MMICs which need high stability and a high quality factor.

FBAR filters are formed by depositing zinc oxide (ZnO), aluminum nitride (AlN)), and the like, which are piezoelectric dielectric materials, on Si or GaAs semiconductor substrates through RF sputtering and cause resonance according to a piezoelectric property. That is, in FBARs, a piezoelectric film is deposited between both electrodes and resonance is generated by causing bulk acoustic waves.

A variety of FBAR structures have been studied until now. In a membrane type FBAR, a silicon oxide ($SiO_2$) layer is deposited on a substrate and a membrane layer is formed using a cavity formed by anisotropic etching an opposite side of the substrate. Also, a lower electrode is formed on the $SiO_2$ layer, a piezoelectric material is deposited on the lower electrode using an RF magnetron sputtering method, and an upper electrode is formed on the piezoelectric layer.

The above membrane type FBAR has advantages such as a less dielectric loss of the substrate caused by the cavity and a less power dissipation. However, due to a large area occupied by a device due to a directivity of the silicon substrate and low structural stability in a following packaging process, the membrane type FBAR has a decrease in a yield caused by damages. Accordingly, recently, an air gap type FBAR and a Bragg reflector type FBAR have appeared to reduce a loss caused by a membrane and to simplify a device manufacturing process.

The Bragg reflector type FBAR has a structure in which a material having an elastic impedance difference is deposited every other layer on a substrate to configure a reflector layer and a lower electrode, a piezoelectric layer, and an upper electrode are sequentially deposited. Here, elastic energy which passes through the piezoelectric layer is not transmitted toward the substrate and is reflected by the reflector layer in order to generate effective resonance. The Bragg reflector type FBAR is structurally strong and has no stress caused by flexure but has disadvantages in which it is difficult to form four or more reflector layers having a precise thickness for total reflection and a lot of time and cost are necessary for manufacturing.

Meanwhile, in a general air gap type FBAR which has a structure in which a substrate and a resonator are separated using an air gap instead of a reflector layer, a sacrificial layer is embodied by isotropically etching a surface of a silicon substrate, surface is ground through chemical mechanical polishing, an insulating layer, a lower electrode, a piezoelectric layer, and an upper electrode are sequentially deposited, an air gap is formed by removing the sacrificial layer through a via hole such that an FBAR is embodied.

In the related art, a piezoelectric layer which has grown in another direction not in a Z-axis direction according to a gradient of an electrode is used as it is in a part of a lower electrode edge area. As a limitation according thereto, due to occurrence of another directional component instead of a vertical direction component which is desired, resonance occurs at an undesired frequency. In the related art, to overcome this, an electrode is prevented from coming into contact with a piezoelectric layer in a section corresponding to an incomplete area such that a voltage drop and mechanical resonance are prevented from being transferred. However, there is present a limitation with respect to another mode which occurs because the incomplete area is not basically removed. In other words, there is a limitation in which a variety of modes of the piezoelectric layer which grows in another direction except the Z-axis direction cause unnecessary resonance.

SUMMARY

It is an aspect of the present invention to provide an air gap type film bulk acoustic resonator (FBAR) capable of improving a resonance property and a method of manufacturing the same.

According to one aspect of the present invention, an air gap type FBAR includes a substrate which includes an air gap portion in a top surface thereof, a lower electrode formed on the substrate, a piezoelectric layer formed on the lower electrode, and an upper electrode formed on the piezoelectric layer. Here, the lower electrode includes a first lower electrode formed spaced apart from the air gap portion in the substrate and a second lower electrode formed on the substrate to be separated from the first lower electrode and to include a non-deposition area of the air gap portion by being deposited to surround only a part of a top of the air gap portion.

The non-deposition area may be an area corresponding to a separation distance between a gap edge of the air gap portion and an electrode edge of the second lower electrode.

The piezoelectric layer may include a channel portion having an air space formed between the lower electrode and the upper electrode near the non-deposition area.

The channel portion may include a complete air space formed by exposing both an upper section of the lower electrode and a lower section of the upper electrode.

The channel portion may include a partial air space in which a lower section of the upper electrode is exposed and an upper side of the lower electrode is not exposed.

The channel portion may be formed to allow a vertical surface or a virtual vertical surface which extends from a channel boundary barrier on one side, which forms the air space, to meet the substrate or the non-deposition area of the air gap portion.

The channel portion may include a first virtual line segment formed by the vertical surface or the virtual vertical surface and the substrate which meet each other and located between an electrode edge of the first lower electrode and a gap edge of the air gap portion.

The channel portion may include a second virtual line segment formed by the vertical surface or the virtual vertical surface and the non-deposition area which meet each other and located between a gap edge of the air gap portion and an electrode edge of the second lower electrode.

According to another aspect of the present invention, a method of manufacturing an air gap type FBAR includes forming a cavity in a top surface of a substrate and then forming a first sacrificial layer on the cavity, forming a lower electrode on the substrate on which the first sacrificial layer is formed, forming a piezoelectric layer on the lower electrode, forming an upper electrode on the piezoelectric layer, and forming an air gap portion corresponding to the cavity by removing the first sacrificial layer. Here, the forming of the lower electrode includes forming a first lower electrode in an area of the substrate spaced apart from the air gap portion and forming a second lower electrode on the substrate to be separated from the first lower electrode and to include a non-deposition area with respect to the air gap portion through depositing to surround only a part of a top of the air gap portion.

The method may further include forming a channel portion having an air space, after the forming of the piezoelectric layer, by etching the piezoelectric layer to expose a space between the upper electrode and the lower electrode near the non-deposition area and forming a second sacrificial layer on the channel portion. Here, the upper electrode may be formed on the piezoelectric layer, on which the second sacrificial layer is formed, and then the first sacrificial layer and the second sacrificial layer may be removed.

The forming of the channel portion may include forming a complete air space by exposing both an upper section of the lower electrode and a lower section of the upper electrode.

The forming of the channel portion may include forming a partial air space in which a lower section of the upper electrode is exposed and an upper side of the lower electrode is not exposed.

The forming of the channel portion may include forming the channel portion to allow a vertical surface or a virtual vertical surface which extends from a channel boundary barrier on one side, which forms the air space, to meet the substrate or the non-deposition area of the air gap portion.

The forming of channel portion may include forming the channel portion to allow a first virtual line segment formed by the vertical surface or the virtual vertical surface and the substrate which meet each other, to be located between an electrode edge of the first lower electrode and a gap edge of the air gap portion.

The forming of channel portion may include forming the channel portion to allow a second virtual line segment formed by the vertical surface or the virtual vertical surface and the non-deposition area which meet each other, to be located between a gap edge of the air gap portion and an electrode edge of the second lower electrode.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION

Hereinafter, exemplary embodiments of the present invention will be described in detail with reference to the attached drawings.

The embodiments of the present invention are provided to more completely explain the present invention to one of ordinary skill in the art. The following embodiments may be modified into a variety of different forms, and the scope of the present invention is not limited thereto. The embodiments are provided to make the disclosure more substantial and complete and to completely convey the concept of the present invention to those skilled in the art.

The terms used herein are to explain particular embodiments and are not intended to limit the present invention. As used herein, singular forms, unless contextually defined otherwise, may include plural forms. Also, as used herein, the term "and/or" includes any and all combinations or one of a plurality of associated listed items. Hereinafter, the embodiments of the present invention will be described with reference to the drawings which schematically illustrate the embodiments.

Figure 1:
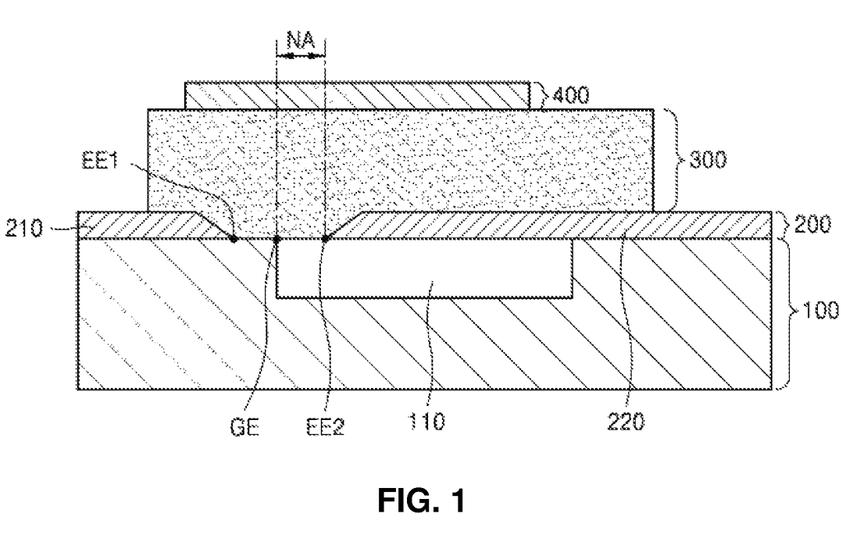
FIG. 1 is a cross-sectional view of an air gap type film bulk acoustic resonator (FBAR) according to one embodiment of the present invention.
Figure 2:
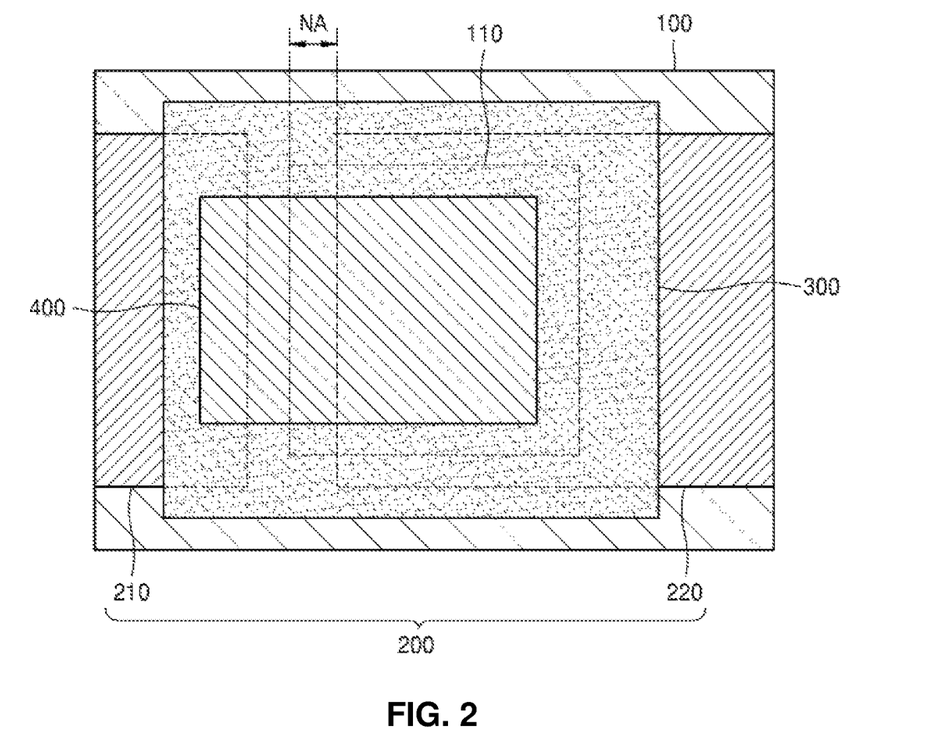
FIG. 2 is a top view of the air gap type FBAR shown in FIG. 1.

FIG. 1 is a cross-sectional view of an air gap type film bulk (FBAR) acoustic resonator according to one embodiment of the present invention, and FIG. 2 is a top view of the air gap type FBAR shown in FIG. 1. Hereafter, like reference numerals refer to like elements having the same function or structure.

Referring to FIGS. 1 and 2, the air gap type FBAR includes a substrate 100, an air gap portion 110, a lower electrode 200, a piezoelectric layer 300, and an upper electrode 400. In the air gap type FBAR, when a signal is applied from the outside to a space between the lower electrode 200 and the upper electrode 400, a part of electrical energy input and transmitted to the space between the two electrodes is converted into mechanical energy according to a piezoelectric effect. In a process of converting the mechanical energy back into electrical energy, resonance occurs with respect to a frequency of natural oscillation according to a thickness of the piezoelectric layer 300.

The substrate 100 is a semiconductor substrate and may use a general silicon wafer and preferably use a high resistivity silicon substrate (HRS). An insulating layer (not shown) may be formed on a top surface of the substrate 100. The insulating layer may employ a thermal oxide film capable of being easily grown on the substrate 100 or may selectively employ an oxide film or a nitride film using a general deposition process such as a chemical vapor deposition and the like.

The air gap portion 110 is formed by forming a cavity in the substrate 100, forming an insulating layer in the cavity, depositing and then planarizing a sacrificial layer on the insulating layer through etching, and removing the sacrificial layer. Here, as the sacrificial layer, a material, which has a surface with excellent roughness and is easily formed and removed, such as poly silicon, zinc oxide (ZnO), and the like, is used. As an example, poly silicon may be employed as the sacrificial layer. The poly silicon may have a surface with excellent roughness, may be easily formed and removed, and may be removed by applying dry etching in a following process.

The lower electrode 200 is formed on the substrate 100 in which the sacrificial layer is present in the cavity. The lower electrode is formed by depositing and patterning a certain material on the substrate 100. A material used for the lower electrode 200 is a general conductive material such as metal and may include one of aluminum (Al), tungsten (W), gold (Au), platinum (Pt), nickel (Ni), titan (Ti), chrome (Cr), palladium (Pd), and molybdenum (Mo). A thickness of the lower electrode 200 may be 10 to 1000 nm.

The lower electrode 200, that is, a plurality of a first lower electrode 210 and a second lower electrode 220 may be formed on the insulating layer and the sacrificial layer of the substrate 100 by patterning. The first lower electrode 210 and the second lower electrode 220 are formed spaced at a certain distance apart.

The first lower electrode 210 may be formed spaced part from the air gap portion 110 in the substrate 100. That is, the first lower electrode 210 is formed on the substrate 100, and an electrode edge EE1 corresponding to one end of the first lower electrode 210 may be spaced at a certain distance or more apart from a gap edge GE of the air gap portion 110. Here, the electrode edge EE1 of the first lower electrode 210 is formed on the substrate 100 to diagonally incline.

The second lower electrode 220 may be formed on the substrate 100 to be separated from the first lower electrode 210. Here, the second lower electrode 220 includes a non-deposition area NA with respect to the air gap portion 110, which is formed by surrounding only a part of a top of the air gap portion of the substrate 100. Referring to FIGS. 1 and 2, the non-deposition area NA may be an area formed between the gap edge GE of the air gap portion 110 and an electrode edge EE2 of the second lower electrode 220.

The piezoelectric layer 300 is formed on the lower electrode 200. The piezoelectric layer 300 may be formed by depositing and then patterning a piezoelectric material on the lower electrode 200. As a general piezoelectric material, aluminum nitride (AlN) or ZnO may be used. A deposition method may include a radio frequency (RF) magnetron sputtering method, an evaporation method, and the like. A thickness of the piezoelectric layer 300 may be 5 to 500 nm.

The piezoelectric layer 300 may include a channel portion having an air space between the lower electrode 200 and the upper electrode 400 near the non-deposition area NA of the air gap portion 110. The channel portion is formed by forming a cavity by etching a part of the piezoelectric layer 300, depositing and planarizing a sacrificial layer on the cavity, and removing the sacrificial layer. Here, as the sacrificial layer, a material, which has a surface with excellent roughness and is easily formed and removed, such as poly silicon, ZnO, and the like, is used. Here, the channel portion may form a complete air space in which both an upper section of the lower electrode 200 and a lower section of the upper electrode 400 are exposed. Also, the channel portion may form a partial air space in which the lower section of the upper electrode 400 is exposed and the upper section of the lower electrode 200 is not exposed.

Figure 3A:
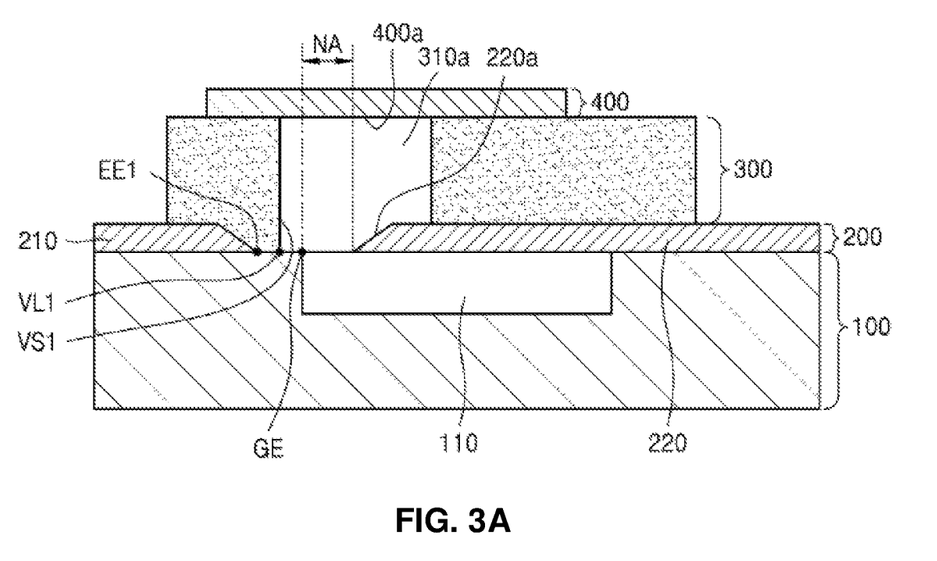
FIG. 3A is a cross-sectional view of the air gap type FBAR according to one embodiment of the present invention.

FIG. 3A is a cross-sectional view of the air gap type FBAR according to one embodiment of the present invention.

Referring to FIG. 3A, both an upper section 220a of the lower electrode 200 and a lower section 400a of the upper electrode 400 are exposed such that a channel portion 310a may form a complete air space. That is, it is shown that a piezoelectric material is removed from a partial area of the piezoelectric layer 300 such that a part of the upper electrode 400 is completely exposed to the air space and a part of the second lower electrode 220 of the lower electrode 200 is completely exposed to the air space. Also, referring to FIG. 3A, since the channel portion 310a of the piezoelectric layer 300 forms the complete air space, a structure in which the complete air space of the channel portion 310a and the air space of the air gap portion 110 formed in the substrate 100 communicate with each other through the non-deposition area NA of the air gap portion 110 is provided.

Meanwhile, the channel portion 310a may include a vertical surface VS1 which extends from a channel boundary barrier on one side, which forms the complete air space, and meets the substrate 100. As shown in FIG. 3A, when a line segment formed by the vertical surface VS1 which extends from the channel boundary barrier and the substrate 100, which meet each other, is referred to as a first virtual line segment VL1, the first virtual line segment VL1 may be located between the electrode edge EE1 of the first lower electrode 210 and the gap edge GE of the air gap portion 110.

Figure 3B:
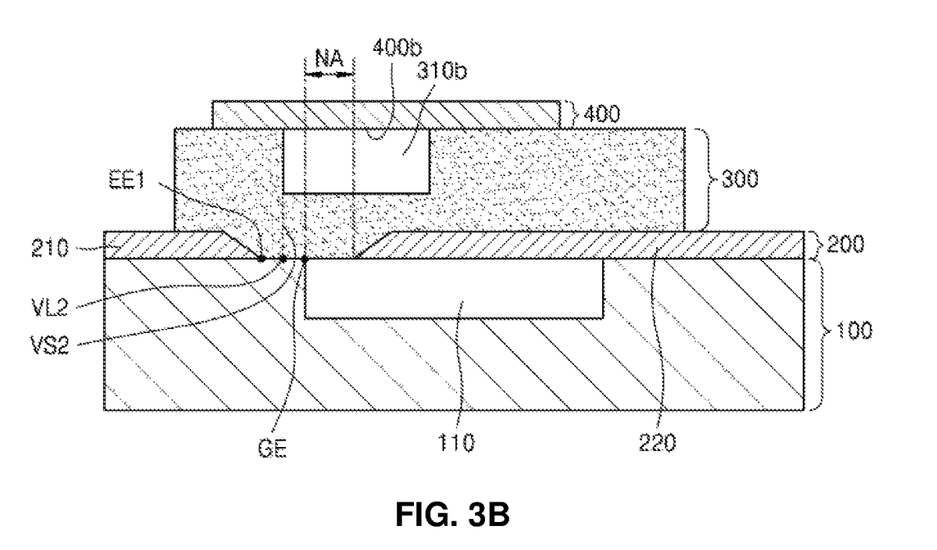
FIG. 3B is a cross-sectional view of an air gap type FBAR according to another embodiment of the present invention.

FIG. 3B is a cross-sectional view of an air gap type FBAR according to another embodiment of the present invention.

Referring to FIG. 3B, a lower section 400b of the upper electrode 400 is exposed such that a channel portion 310b may form a partial air space. That is, a piezoelectric material is removed from a partial area of the piezoelectric layer 300 such that a part of the upper electrode 400 is exposed to the air space and the lower electrode 200 is not exposed to the air space. Also, referring to FIG. 3B, since the channel portion 310b of the piezoelectric layer 300 forms the partial air space, the partial air space of the channel portion 310b is obstructed from the air space of the air gap portion 110 formed in the substrate 100 by the piezoelectric material of the piezoelectric layer 300.

Meanwhile, in the channel portion 310b, a virtual vertical surface VS2 which extends from a channel boundary barrier on one side which forms the partial air space may meet the substrate 100. As shown in FIG. 3B, when a line segment formed by the virtual vertical surface VS2 which extends from the channel boundary barrier and the substrate 100, which meet each other, is referred to as a second virtual line segment VL2, the second virtual line segment VL2 may be located between the electrode edge EE1 of the first lower electrode 210 and the gap edge GE of the air gap portion 110.

Figure 4A:
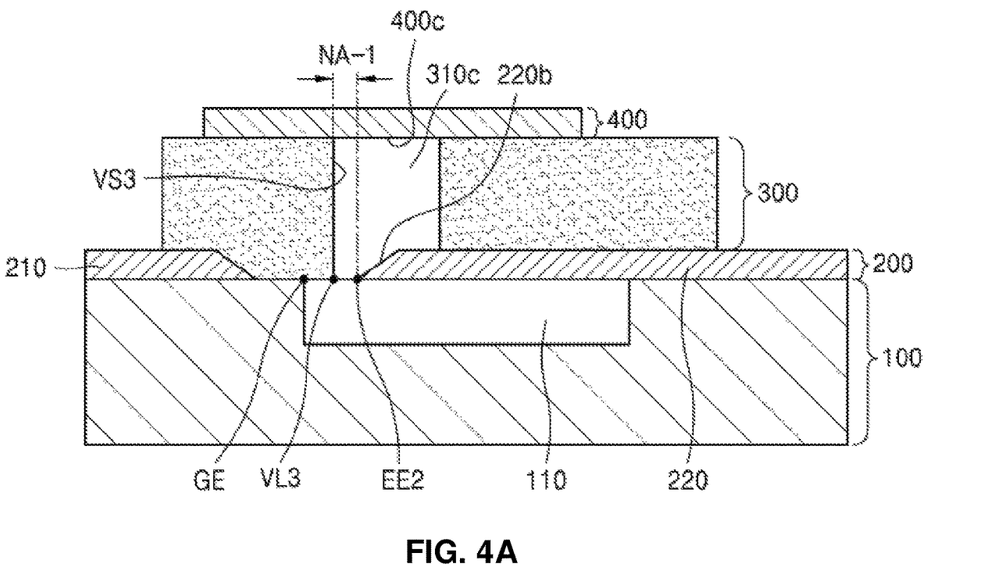
FIG. 4A is a cross-sectional view of an air gap type FBAR according to still another embodiment of the present invention.

FIG. 4A is a cross-sectional view of an air gap type FBAR according to still another embodiment of the present invention.

Referring to FIG. 4A, since both an upper section 220b of the lower electrode 200 and a lower section 400c of the upper electrode 400 are exposed, a channel portion 310c may form a complete air space. That is, it is shown that a piezoelectric material is removed from a partial area of the piezoelectric layer 300 such that a part of the upper electrode 400 is completely exposed to the air space and a part of the second lower electrode 220 of the lower electrode 200 is completely exposed to the air space. Also, referring to FIG. 4A, since the channel portion 310c of the piezoelectric layer 300 forms the complete air space, a structure in which the complete air space of the channel portion 310c and the air space of the air gap portion 110 formed in the substrate 100 communicate with each other through a partial area NA-1 of the non-deposition area NA of the air gap portion 110 is provided.

Meanwhile, the channel portion 310c may include a vertical surface VS3 which extends from a channel boundary barrier on one side, which forms the complete air space, and meets an upper air space of the air gap portion 110. As shown in FIG. 4A, when a line segment formed by the vertical surface VS3 which extends from the channel boundary barrier and the upper air space of the air gap portion 110, which meet each other, is referred to as a third virtual line segment VL3, the third virtual line segment VL3 may be located between the gap edge GE of the air gap portion 110 and the electrode edge EE2 of the second lower electrode 220.

Figure 4B:
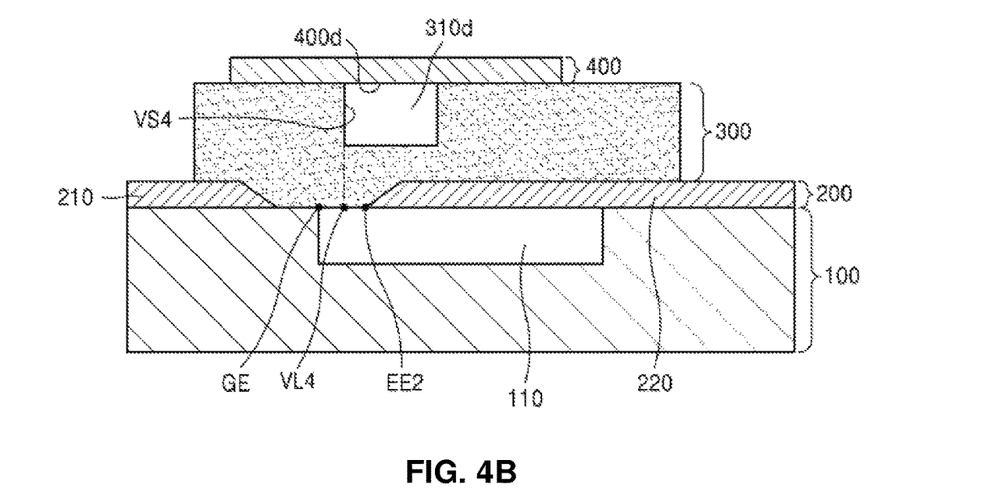
FIG. 4B is a cross-sectional view of an air gap type FBAR according to yet another embodiment of the present invention.

FIG. 4B is a cross-sectional view of an air gap type FBAR according to yet another embodiment of the present invention.

Referring to FIG. 4B, a lower section 400d of the upper electrode 400 is exposed such that a channel portion 310d may form a partial air space. That is, a piezoelectric material is removed from a partial area of the piezoelectric layer 300 such that a part of the upper electrode 400 is completely exposed to the air space and the lower electrode 200 is not exposed to the air space. Also, referring to FIG. 4B, since the channel portion 310d of the piezoelectric layer 300 forms the partial air space, the partial air space of the channel portion 310d is obstructed from the air space of the air gap portion 110 formed in the substrate 100 by the piezoelectric material of the piezoelectric layer 300.

Meanwhile, in the channel portion 310d, a virtual vertical surface VS4 which extends from a channel boundary barrier on one side which forms the partial air space may meet the upper air space of the air gap portion 110. As shown in FIG. 4B, when a line segment formed by the virtual vertical surface VS4 which extends from the channel boundary barrier and the upper air space of the air gap portion 110, which meet each other, is referred to as a fourth virtual line segment VL4, the fourth virtual line segment VL4 may be located between the gap edge GE of the air gap portion 110 and the electrode edge EE2 of the second lower electrode 220.

The upper electrode 400 is formed on the piezoelectric layer 300. When a sacrificial layer is formed to form the channel portion 310a, 310b, 310c, or 310d on the piezoelectric layer 300, the upper electrode 400 may be also formed on the sacrificial layer. The upper electrode 400 may be formed by depositing and patterning a metal film for an upper electrode in a certain area on the piezoelectric layer 300. The upper electrode 400 may be formed by using the same material, deposition method, and patterning method as those of the lower electrode 200. A thickness of the upper electrode 400 may be 5 to 1000 nm.

Meanwhile, although not shown in the drawings, a pad layer to be applied to parts of the lower electrode 200, the piezoelectric layer 300, and the upper electrode 400, which have been described above, may be formed. The pad layer functions as a cover for protecting the lower electrode 200, the piezoelectric layer 300, and the upper electrode 400.

The above-described air gap type FBAR has a structure in which an RF signal input to the upper electrode 400 is output to the lower electrode 200 through the piezoelectric layer 300. Here, since the piezoelectric layer 300 has a constant resonance frequency, only an RF signal having the same frequency which coincides with that of the piezoelectric layer 300 is output among the input RF signal and other frequencies become extinct. Accordingly, the lower electrode 200, the piezoelectric layer 300, and the upper electrode 400 are configured as described above such that an FBAR filter having a constant central frequency and a constant bandwidth may be embodied.

Figure 5:
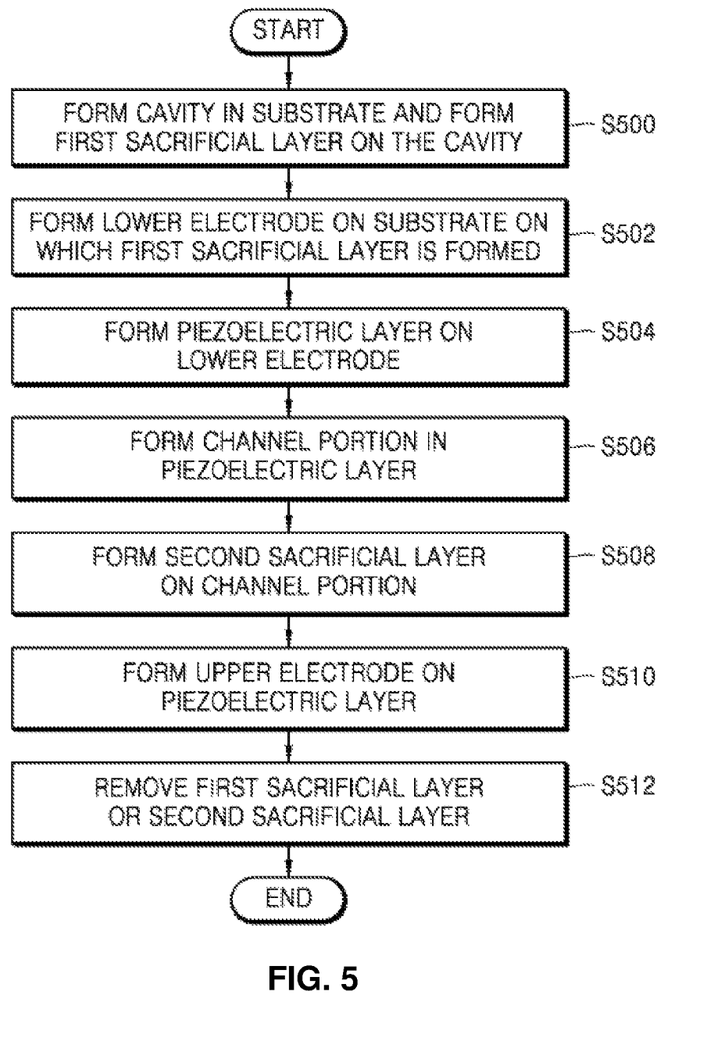
FIG. 5 is a flowchart illustrating a method of manufacturing an air gap type FBAR according to one embodiment of the present invention.

FIG. 5 is a flowchart illustrating a method of manufacturing an air gap type FBAR according to one embodiment of the present invention, and FIGS. 6A to 6G are cross-sectional views sequentially illustrating a process of manufacturing the air gap type FBAR according to one embodiment of the present invention.

Figure 6A:
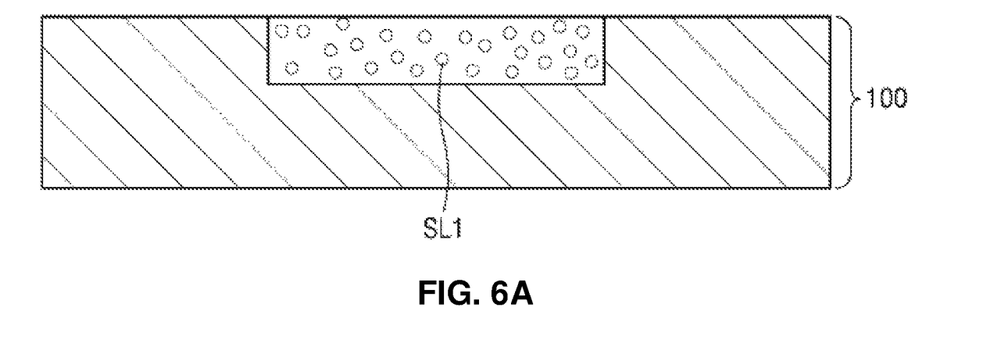
FIGS. 6A to 6G are cross-sectional views sequentially illustrating a process of manufacturing the air gap type FBAR according to one embodiment of the present invention.

First, a cavity is formed in a top surface of a substrate, and then a sacrificial layer is formed on the cavity (S500). Referring to FIG. 6A, a cavity is formed by anisotropically etching a certain area the substrate at 2 to 3 μm. An insulating layer having a certain thickness may be stacked on the substrate in which the cavity is formed. The insulating layer may include silicon dioxide ($SiO_2$), aluminum oxide ($Al_2O_3$), or the like and may be formed by an RF magnetron sputtering method, an evaporation method, or the like. Afterwards, a first sacrificial layer SL1 is formed on the substrate in which the cavity is formed, and then the first sacrificial layer SL1 is etched and planarized.

After operation S500, a lower electrode is formed on the substrate in which the cavity is formed (S502). Since resonance efficiency is high when the lower electrode 200 is located on the air gap portion 110, it is necessary to pattern such that the air gap portion 110 is surrounded by a certain area. A material used for the lower electrode 200 may include one of Al, W, Au, Pt, Ni, Ti, Cr, Pd, and Mo.

Figure 6B:
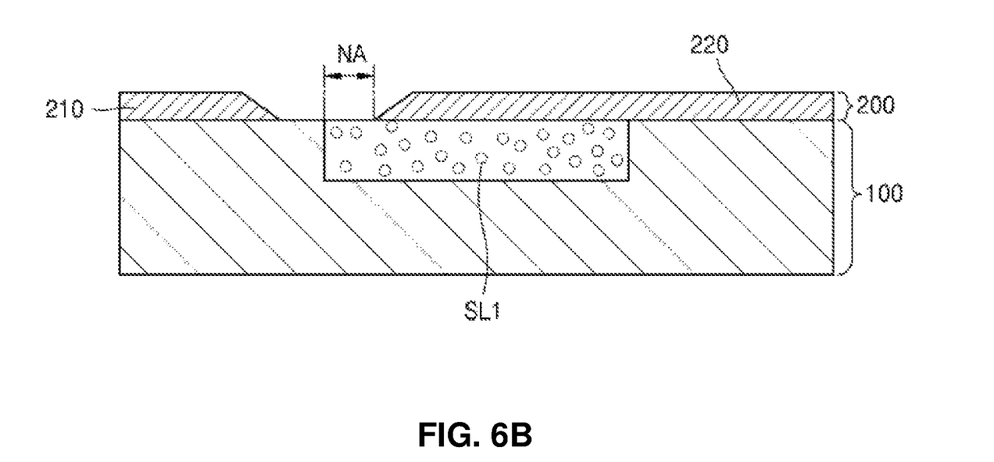

The forming of the lower electrode 200 includes a process of forming the first lower electrode 210 and the second lower electrode 220. Referring to FIG. 6B, to form the air gap portion 110 in the substrate 100, the first lower electrode 210 is formed in an area spaced at a certain distance apart from the cavity on which the first sacrificial layer SL1 is formed. Also, the second lower electrode 220 may be formed on the substrate 100 while being separated from the first lower electrode 210 by being stacked to surround only a part of a top of the air gap portion 110 in the substrate 100. The non-deposition area NA may be formed by stacking the second lower electrode 220 to surround only the part of the air gap portion 110. The non-deposition area NA may be an area between the gap edge GE of the cavity and the electrode edge EE2 of the second lower electrode 220.

Figure 6C:
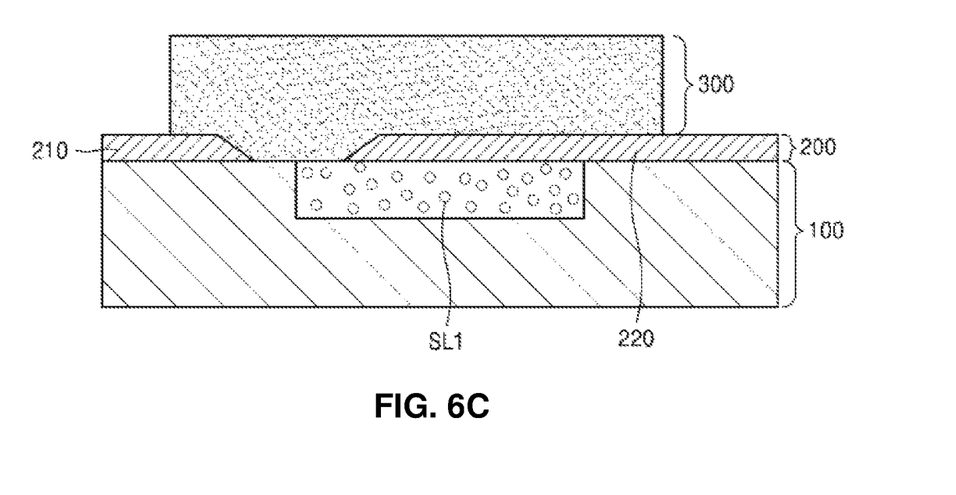

After operation S502, the piezoelectric layer 300 is formed on the lower electrode 200 (S504). Referring to FIG. 6C, the piezoelectric layer is deposited on a partial area of the substrate 100 which includes the lower electrode 200 and the first sacrificial layer SL1. As a general piezoelectric material, AlN or ZnO may be used. As a deposition method, any one of an RF magnetron sputtering method and an evaporation method may be used.

After operation S504, the channel portion having an air space may be formed by etching the piezoelectric layer 300 to expose a space between the lower electrode 200 and the upper electrode 400 near the non-deposition area NA (S506). Here, the channel portion may have a complete air space formed by exposing both an upper section of the lower electrode 200 and a lower section of the upper electrode 400 or a partial air space in which the lower section of the upper electrode 400 is exposed and an upper side of the lower electrode 200 is not exposed.

Figure 6D:
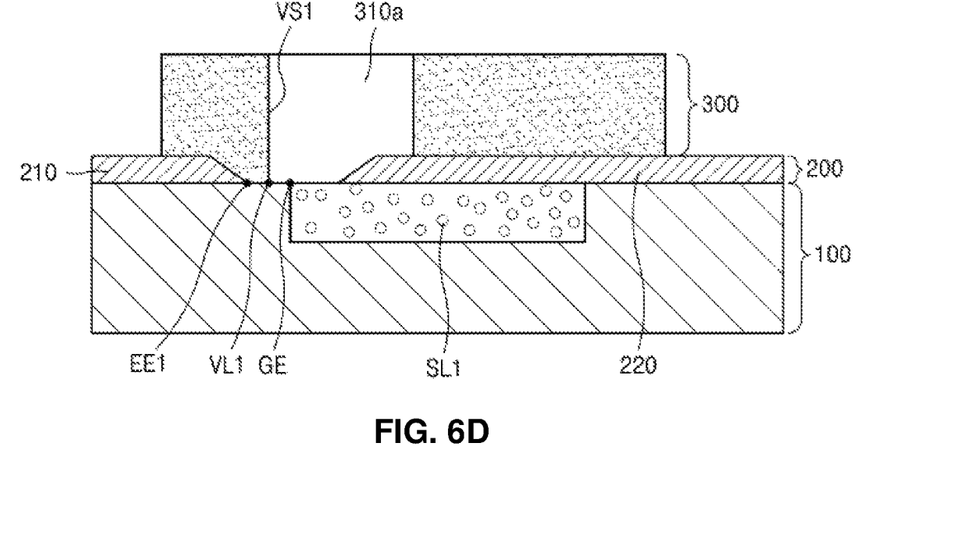

The channel portion may be formed such that a vertical surface or a virtual vertical surface which extends from a channel boundary barrier on one side which forms the air space, may meet the substrate 100 or the air gap portion 110. The channel portion may include a first virtual line segment formed by the vertical surface or the virtual vertical surface and the substrate 100 which meet each other and located between the electrode edge of the first lower electrode 210 and the gap edge of the air gap portion 110. Also, the channel portion may include a second virtual line segment formed by the vertical surface or the virtual vertical surface and the substrate 100 which meet each other and located between the gap edge of the air gap portion 110 and the electrode edge of the second lower electrode 220. FIG. 6D illustrates that the channel portion 310a is formed on the piezoelectric layer 300. Referring to FIG. 6D, it may be checked that the vertical surface VS1 which extends from the channel boundary barrier on one side which forms the air space meets the substrate 100 in the channel portion 310a. Here, the first virtual line segment VL1 formed by the vertical surface VS1 and the substrate 100 which meet each other may be located between the electrode edge EE1 of the first lower electrode 210 and the gap edge GE of the air gap portion 110. FIG. 6D illustrates a process of forming the above-described channel portion of FIG. 3A. Accordingly, since the above-described channel portion of FIGS. 3B to 3D is formed through the same process shown in FIG. 6D, the process will be described below with reference to FIG. 6D.

Figure 6E:
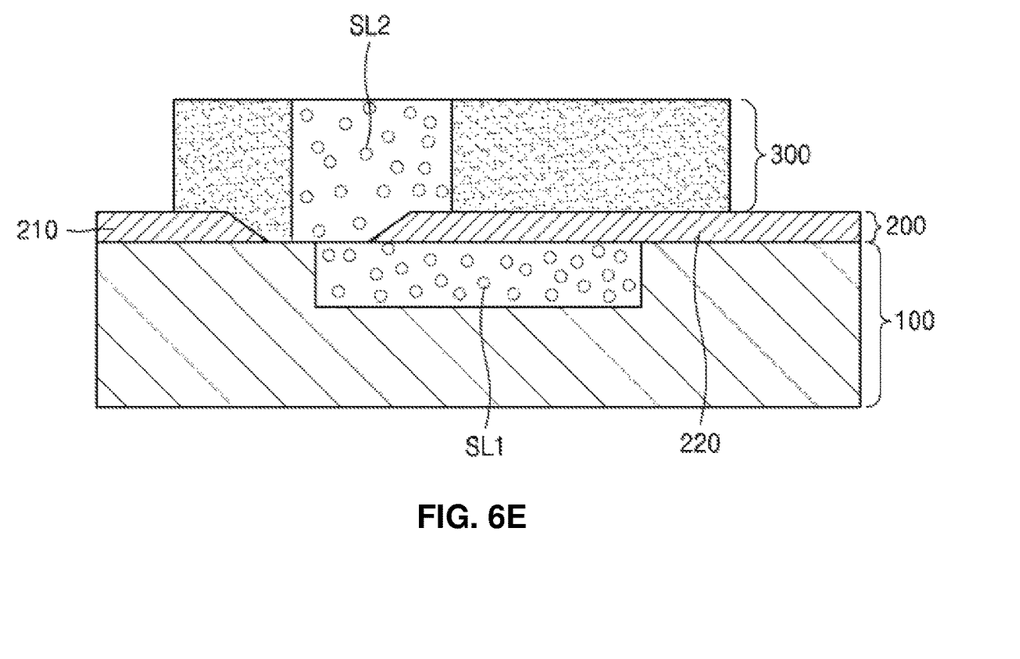

After operation S506, a second sacrificial layer is formed on the channel portion formed in the piezoelectric layer 300 (S508). Referring to FIG. 6E, the channel portion 310a is formed by forming a cavity by etching a partial area of the piezoelectric layer 300 and the depositing the second sacrificial layer SL2 on a top of the cavity. Here, the second sacrificial layer SL2 may be formed of equal or similar to that of the first sacrificial layer SL1. That is, a material, which has a surface with excellent roughness to easily form and remove a sacrificial layer, such as poly silicon, ZnO, and the like, may be used.

Meanwhile, operations S506 and S508 of forming the above-described channel portion and forming the second sacrificial layer are not essential and may be omitted, and following operation S510 may be performed after operation S504.

Figure 6F:
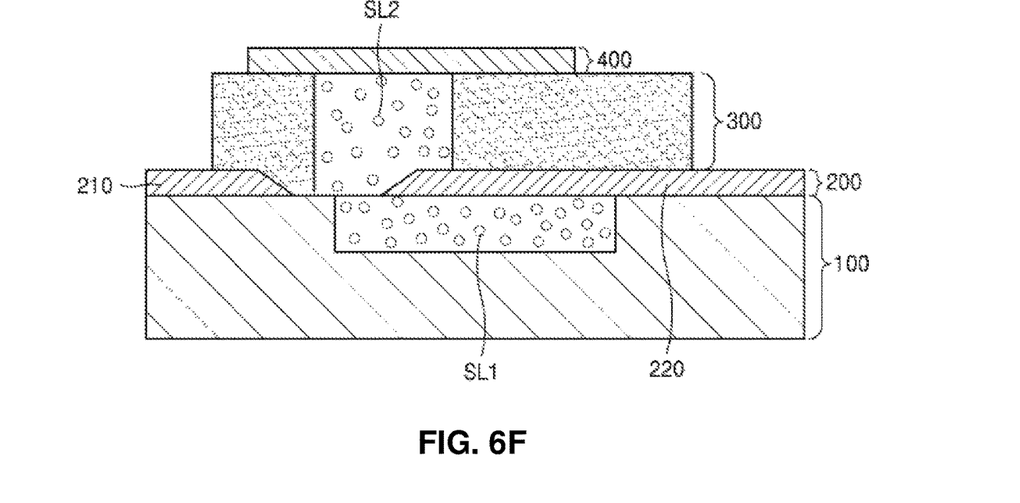

After operation S508, the upper electrode 400 is formed on the piezoelectric layer 300 (S510). When the second sacrificial layer is formed on the piezoelectric layer 300 to form the channel portion, the upper electrode 400 may be formed on the second sacrificial layer. FIG. 6F illustrates that the upper electrode 400 is formed on the piezoelectric layer 300 on which the second sacrificial layer SL2 is formed, to form the channel portion 310a. The upper electrode 400 may be formed by depositing and patterning a metal film for an upper electrode in a certain area on the piezoelectric layer 300. The upper electrode 400 may be formed by using the same material, deposition method, and patterning method as those of the lower electrode 200.

Meanwhile, although not shown in the drawings, a pad layer to be applied to parts of the lower electrode 200, the piezoelectric layer 300, and the upper electrode 400, which have been described above, may be formed. The pad layer may function as a cover for protecting the lower electrode 200, the piezoelectric layer 300, and the upper electrode 400.

Figure 6G:
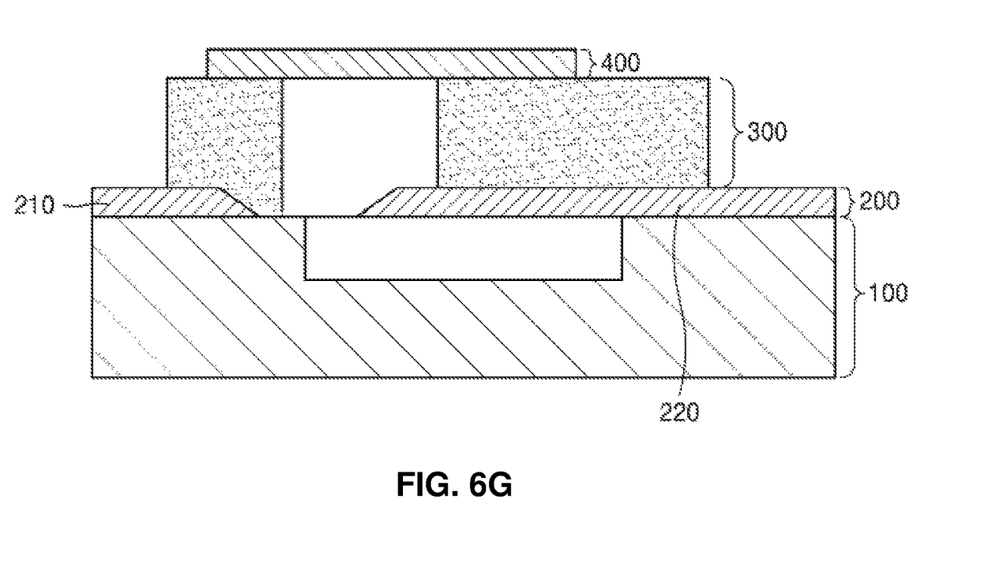

After operation S510, the air gap portion 110 corresponding to the cavity may be formed by removing the first sacrificial layer SL1 formed on the cavity of the substrate 100 (S512). Also, when the second sacrificial layer SL2 is formed on the channel portion of the piezoelectric layer 300, the channel portion 310a having an air space may be formed by removing the second sacrificial layer SL2. Referring to FIG. 6G, an etching hole is formed by removing a part of the substrate 100 or the piezoelectric layer 300.

The etching hole is formed by a dry-etching or wet-etching method. An inner diameter of the etching hole is about 10 μm to 100 μm. Through the etching hole as described above, the air gap portion 110 may be formed by removing the first sacrificial layer SL1 and the channel portion 310a may be formed by removing the second sacrificial layer SL2.

According to the embodiments of the present invention, since there is provided a structure in which a piezoelectric layer in an incomplete area which is a problem in the related art is etched, a voltage drop naturally occurs.

Also, the incomplete area is removed such that there is provided an effect in which unnecessary mechanical resonance is not transferred in every direction adjacent to the piezoelectric layer having a variety of modes as well as a vertical direction thereof.

The exemplary embodiments of the present invention have been described above. One of ordinary skill in the art may understand that modifications may be made without departing from the scope of the present invention. Therefore, the disclosed embodiments should be considered in a descriptive aspect not a limitative aspect. The scope of the present invention is defined by the claims not the above description, and all differences within the equal scope thereof should be interpreted as being included in the present invention.

What is claimed is:

1. An air gap type film bulk acoustic resonator (FBAR) comprising:
   a substrate which comprises an air gap portion in a top surface thereof;
   a lower electrode formed on the substrate;
   a piezoelectric layer formed on the lower electrode; and
   an upper electrode formed on the piezoelectric layer, wherein the lower electrode comprises:
   a first lower electrode formed spaced apart from the air gap portion in the substrate; and
   a second lower electrode formed on the substrate to be separated from the first lower electrode and to include a non-deposition area of the air gap portion by being deposited to surround only a part of a top of the air gap portion;
   wherein the piezoelectric layer comprises a channel portion having an air space formed between the lower electrode and the upper electrode near the non-deposition area, and the channel portion is formed to allow a vertical surface or a virtual vertical surface which extends from a channel boundary barrier on one side, which forms the air space, to meet the substrate or the non-deposition area of the air gap portion.

2. The air gap type FBAR of claim 1, wherein the non-deposition area is an area corresponding to a separation distance between a gap edge of the air gap portion and an electrode edge of the second lower electrode.

3. The air gap type FBAR of claim 1, wherein the channel portion comprises a complete air space formed by exposing both an upper section of the lower electrode and a lower section of the upper electrode.

4. The air gap type FBAR of claim 1, wherein the channel portion comprises a partial air space in which a lower section of the upper electrode is exposed and an upper side of the lower electrode is not exposed.

5. The air gap type FBAR of claim 1, wherein the channel portion comprises a first virtual line segment formed by the vertical surface or the virtual vertical surface and the substrate which meet each other and located between an electrode edge of the first lower electrode and a gap edge of the air gap portion.

6. The air gap type FBAR of claim 1, wherein the channel portion comprises a second virtual line segment formed by the vertical surface or the virtual vertical surface and the non-deposition area which meet each other and located between a gap edge of the air gap portion and an electrode edge of the second lower electrode.

* * * * *